(12) United States Patent
Mullen

(10) Patent No.: US 10,299,392 B2
(45) Date of Patent: May 21, 2019

(54) INTEGRALLY BONDED AND INSTALLED PROTECTIVE ENCLOSURE

(71) Applicant: Goodrich Corporation, Charlotte, NC (US)

(72) Inventor: James A. Mullen, Wadsworth, OH (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 15/782,375

(22) Filed: Oct. 12, 2017

(65) Prior Publication Data

US 2019/0116679 A1     Apr. 18, 2019

(51) Int. Cl.

| H05K 5/00 | (2006.01) |
| H01R 13/66 | (2006.01) |
| H05K 7/14 | (2006.01) |
| H05K 5/06 | (2006.01) |

(52) U.S. Cl.
CPC ........... *H05K 5/0056* (2013.01); *H01R 13/66* (2013.01); *H05K 5/064* (2013.01); *H05K 7/14* (2013.01)

(58) Field of Classification Search
CPC .............................. H02G 15/003; H02G 15/04
USPC ....... 174/76; 219/203; 29/841; 439/936, 521
See application file for complete search history.

(56) References Cited

U.S. PATENT DOCUMENTS

| 5,099,088 | A | * | 3/1992 | Usami ................. H01R 4/22 |
| | | | | 156/49 |
| 5,513,075 | A | | 4/1996 | Capper et al. |
| 5,976,339 | A | | 11/1999 | Andre, Sr. |
| 7,004,221 | B2 | | 2/2006 | Moore, Jr. et al. |
| 7,232,953 | B2 | * | 6/2007 | Torii .................... H01R 4/22 |
| | | | | 174/74 R |
| 8,187,016 | B2 | * | 5/2012 | Vijh ................. H01R 13/5205 |
| | | | | 439/271 |
| 8,966,692 | B2 | * | 3/2015 | Dewar ................. B21D 47/00 |
| | | | | 14/73 |
| 2013/0112475 | A1 | | 5/2013 | Magno, Jr. et al. |
| 2015/0183168 | A1 | | 7/2015 | Liverman et al. |
| 2016/0325493 | A1 | | 11/2016 | DeSimone et al. |
| 2017/0197359 | A1 | | 7/2017 | Yang et al. |

FOREIGN PATENT DOCUMENTS

| DE | 102006056258 A1 | 5/2008 |
| EP | 3177119 A1 | 6/2017 |
| WO | WO2017/035584 A1 | 3/2017 |

OTHER PUBLICATIONS

Extended European Search Report for EP Application No. 18199690.1, dated Jan. 23, 2019, 9 pages.

\* cited by examiner

*Primary Examiner* — Phuong K Dinh

(74) *Attorney, Agent, or Firm* — Kinney & Lange, P.A.

(57) ABSTRACT

A protective enclosure for an electrically-conductive element disposed along a component surface includes a base, a first side with an electrical connector, and a second side with an aperture for receiving a potting material. The base, the first side, and the second side at least partially define an internal void, and the internal void communicates with an external environment via the aperture.

20 Claims, 3 Drawing Sheets

US 10,299,392 B2

INTEGRALLY BONDED AND INSTALLED PROTECTIVE ENCLOSURE

BACKGROUND

Aircraft wiring can be subjected to flexing, displacement, and other stresses, as well as extreme operating conditions, depending on the type of aircraft and aircraft system. Electrical wiring can be protected using strain relief devices, such as clamps, or encapsulation in a potting material. Current potting molds can be cumbersome, and often require removal of the mold and further processing of the cured potting material. These molds may be prone to leaking or pooling of uncured potting material. Potted areas may also be sensitive to poor bonding, which can result in structural or electrical connection failures and/or moisture intrusion.

SUMMARY

A protective enclosure for an electrically-conductive element disposed along a component surface includes a base, a first side with an electrical connector, and a second side with an aperture for receiving a potting material. The base, the first side, and the second side at least partially define an internal void, and the internal void communicates with an external environment via the aperture.

A method of making a protective enclosure for an electrically-conductive element disposed along a component surface includes forming a base, forming a first side with an electrical connector, and forming a second side with an aperture extending therethrough. The method further includes connecting the base, the first side, and the second side such that they at least partially form an internal void.

DETAILED DESCRIPTION

The present invention is directed to a potting mold designed to enclose electrical wiring or other electrical components. The potting mold can be formed to fit the dimensions of a specific area, using less material and taking up less space than traditional molds. Once filled with the potting material, the mold protects and relieves strain on potted components. The mold can include internal features used to help anchor or support enclosed components.

Figure 1:
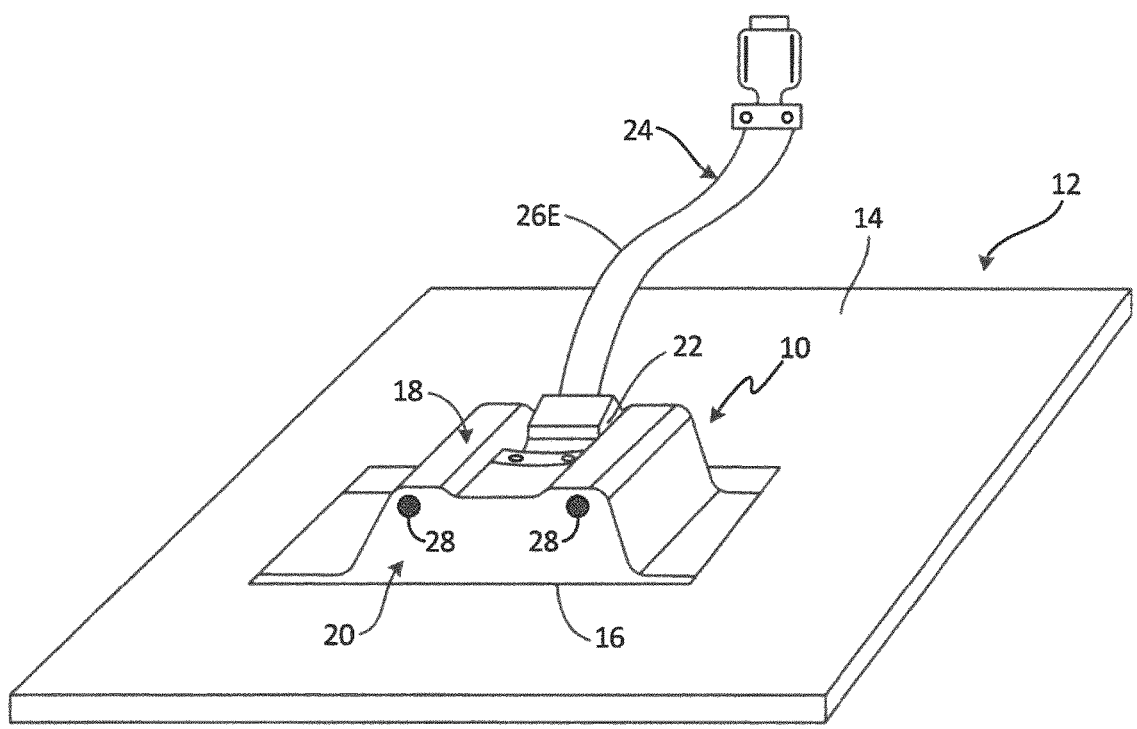
FIG. 1 is a perspective view of a protective enclosure mounted to a panel.

FIG. 1 is a perspective view of potting enclosure 10 mounted to panel 12 such that surface 14 of panel 12 is in contact with base 16 of enclosure 10. Panel 12 can be a heated floor panel, for example, or another planar structure that receives wires or cables. Enclosure 10 includes connector side 18 and fill side 20. Connector 22 is mounted to connector side 18, and is configured to connect an external portion $26_E$ of conductive element 24 with internal portion $26_I$ (shown in FIG. 2). In other embodiments, connector 22 can be an integral part of connector side 22. It can be alternatively be made to accommodate a "flying lead" such that it is formed as an opening within connector side 18 through which conductive element 24 can be passed. Fill side 20 includes apertures 28 through which potting material can be introduced into enclosure 10. In other embodiments, enclosure 10 can include a single aperture 28, or more than two apertures 28 on one or more fill sides 20.

Figure 2:
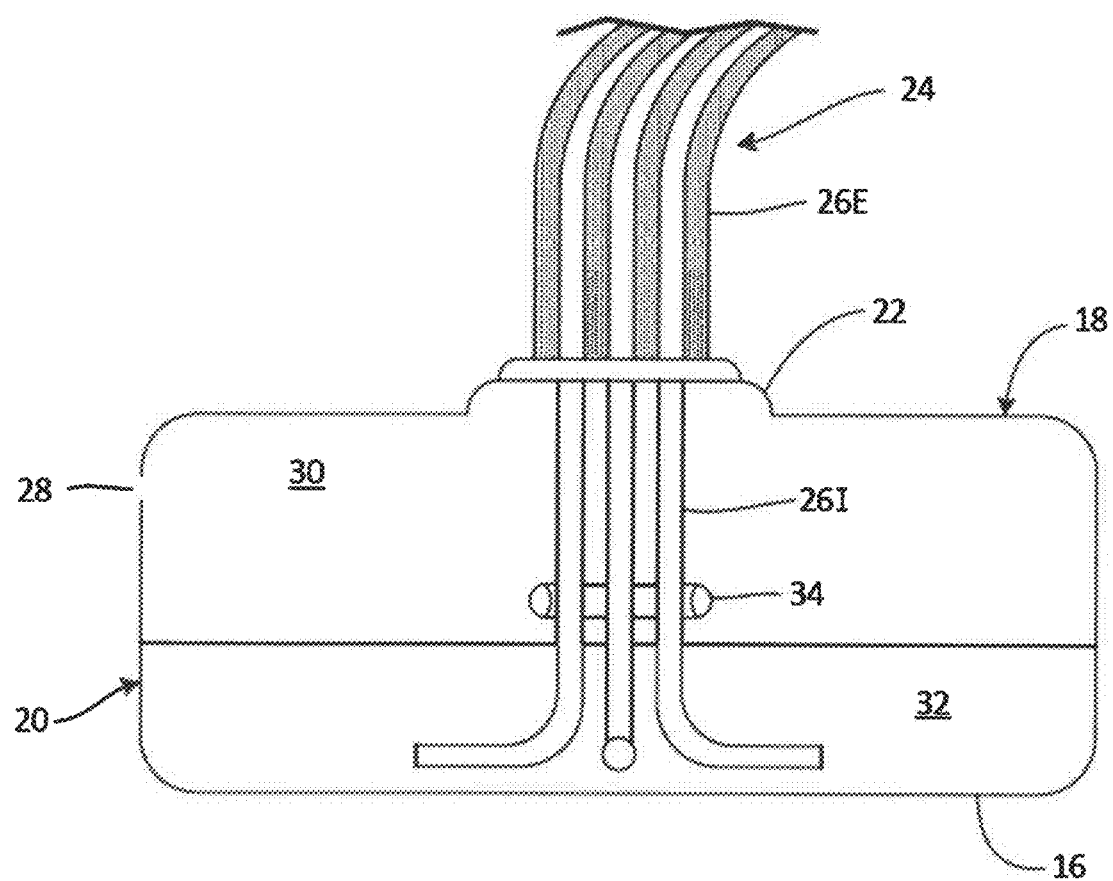
FIG. 2 is a simplified cross-section of the protective enclosure of FIG. 1.

FIG. 2 is a simplified cross-section of enclosure 10, shown detached from panel 12. As can be seen in FIG. 2, the various sides of enclosure 10 form internal void 30. In the embodiment shown, conductive element 24 is a group of electrical wires with external and internal portions $26_E$ and $26_I$, respectively, meeting at connector 22. The external portion $26_E$ of conductive element 24 is harnessed, while the wires of conductive element 24 are separated within void 30 to form internal portion $26_I$. In another embodiment, conductive element 24 can include a single wire, or a group of wires that remain bundled within void 30. In yet another embodiment, conductive element 24 can generally be an electrical element, such as a coil, a capacitor, a rectifier, or a sensor, to name a few, non-limiting examples.

Potting material 32 is introduced to void 30 via one or more apertures 28. In the embodiment shown, potting material 32 occupies only a portion of void 30, covering part of internal portion $26_I$ of wires 24. In other embodiments, potting material 32 can occupy less or more of the volume of void 30, depending on factors such as the type of conductive element 24, orientation of enclosure 10, or operating environment. Once cured, potting material 32 helps reduce strain on conductive element 24 from vibration, impact, or other movement. Potting material 32 also protects conductive element 24 from moisture and other contaminants.

Potting material 32 can be an epoxy-based material, and can include single or multi-component epoxy systems. Potting material 32 can further include foaming and/or expanding epoxies that are lighter in weight than other epoxies. For certain applications, such as for use inside an aircraft fuselage, potting material 32 can be a fire resistant, low smoke/toxicity (FST-type) epoxy. In other embodiments, potting material 32 can be a polymer-based material, such as silicones, urethanes, polyamides, butyls, and polyolefins, to name a few, non-limiting examples.

Enclosure 10 can include restraint 34 within void 30. Restraint 34 is an anchoring mechanism that can be used to properly position and hold conductive element 24 in place before and during the curing period of potting material 32. Restraint 34 can also generally provide additional strain relief for conductive element 24. In the embodiment shown, restraint 34 is a clamp-like device, but can also be configured as a hook, loop, bushing, or other suitable restraint. In other embodiments, enclosure 10 can also include a plurality of restraints 34. Conversely, restraint 34 can include one or more restraints located on the exterior of enclosure 10 allowing for the restraint of a service loop in element 24, or it can serve as an anchor point for supplemental components.

Figure 3:
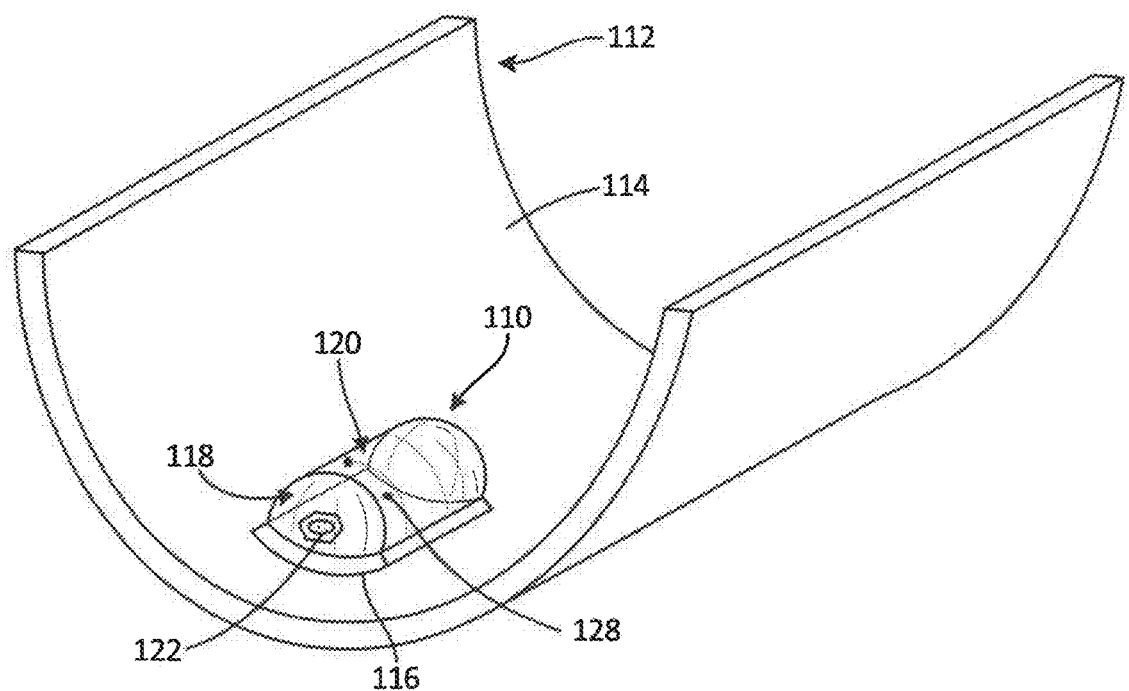
FIG. 3 is a perspective view of an alternative protective enclosure mounted to a leading edge surface.

FIG. 3 is a perspective view of alternative enclosure 110, attached to workpiece 112, which can be, for example, a leading edge of an aircraft component. Specifically, enclosure 110 is attached at its base 116 to an inner surface 114 of workpiece 112. As such, base 116 is curved to match the curvature of inner surface 114. Enclosure 110 includes connector side 118 and connector 122. Although shown (for simplicity) without a conductive element, connector 122 is configured to interface with the types of the conductive elements 24 referenced above with respect to enclosure 10. In the embodiment shown, connector side 118 is generally orthogonal to base 116, but could be formed as parallel to base 116, as is shown in the embodiments of FIGS. 1 and 2. Enclosure 110 also includes fill side 120 having apertures 128. As with enclosure 10, fill side 120 can include only a single aperture, or have more than two apertures arranged on one or more sides of enclosure 110.

As is shown in FIG. 3, enclosure 110 can be formed from a material that is at least partially transparent. Using such a material allows for viewing of the internal components and the potting process. This can be useful for facilitating proper placement of enclosure 110 over or around electrical components, and for ensuring desired coverage of the components by the potting material. Operators can continue to view the potted area through enclosure 110, which, like enclosure 10, is intended to remain situated over potted components. Although shown in FIG. 1 as an opaque structure, it is also possible for enclosure 10 to be formed from a transparent material.

Enclosures 10, 110 can be formed using a 3D printing technique. Specifically, enclosures 10, 110 can be formed using a vat photopolymerization technique, such as stereolithography. By using 3D printing, enclosures 10, 110 can be formed to the exact dimensions of a specific area, and can be made to accommodate many types of electrical and other components. Enclosures 10, 110 can be made to have thinner walls/sides than traditional molds. Also unlike traditional molds, enclosures 10, 110 can have localized variations in wall thicknesses. For example, it may be desirable to make one side of enclosure 10, 110 thicker in certain areas, or thicker, altogether, than the remaining sides, depending on the surrounding environment and potential hazards. Materials used to form enclosures 10, 110 can include polymers, such as polyamides, acrylonitrile-butadiene-styrene (ABS), and polyurethanes. The materials can also include resin only and/or reinforced epoxies or phenolics. Other suitable materials are contemplated herein.

Using 3D printing allows for a connector to be positioned orthogonal to the base, as is shown in FIG. 3. Apertures can also be formed in a number of surfaces, including side (FIGS. 1 and 2) and top (FIG. 3) locations. Bases 16, 116 can be contoured to match the surface to which they are attached. This includes planar surfaces, such as panel 12, or curved surfaces, such as workpiece 112. Other shapes or contours are contemplated herein. As is shown in FIGS. 1 and 3, bases 16, 116 can also be flanged such that they extend beyond one or more of the generally orthogonal sides of enclosure 10, 110. The specific footprint of the flanged bases can be optimized to balance weight and spatial impact against the surface area required to ensure proper bonding under the loading conditions of panel 12 or workpiece 112. Finally, the use of 3D printing also allows for "enhancements" such as internal or external restraints or fasteners, or transparent build material.

Once formed, enclosures 10, 110 are placed over or around the area and components to be protected, and are attached to the corresponding surface using, for example, and adhesive. Other bonding techniques are contemplated herein. In some cases, enclosures 10, 110 can completely surround the conductive element, and need not be attached to another structure. Once attached, the desired amount of potting material can be added and allowed to cure. Unlike traditional molds, enclosures 10, 110 need not be removed after curing is complete, but can be removed if so desired.

The disclosed potting enclosures have many advantages. First, they can be formed to exact dimensions of the area to be protected, and can be contoured for mounting on planar or non-planar surfaces. Enclosure walls can be made thinner than those of traditional molds. Due to their tailored design, the disclosed enclosures are less prone to leaking. In addition to aerospace applications, the disclosed enclosures can be used in other transportation industries, or any application requiring encapsulation of electrical components.

DISCUSSION OF POSSIBLE EMBODIMENTS

The following are non-exclusive descriptions of possible embodiments of the present invention.

A protective enclosure for an electrically-conductive element disposed along a component surface includes a base, a first side with an electrical connector, and a second side with an aperture for receiving a potting material. The base, the first side, and the second side at least partially define an internal void, and the internal void communicates with an external environment via the aperture.

The enclosure of the preceding paragraph can optionally include, additionally and/or alternatively, any one or more of the following features, configurations and/or additional components:

The base is mountable to the component surface.

The electrically-conductive element includes a wire.

The potting material covers at least a portion of the electrically-conductive element within the internal void.

The potting material includes an epoxy material or a polymer material.

The component is a floor panel or a leading edge.

The base, the first side, and the second side are formed from a material selected from the group consisting of: nylon, ABS, polyurethane, epoxy, phenolic, and combinations thereof.

The material is semitransparent.

The first side is orthogonal to the base.

The first side is parallel to the base.

The base is non-planar.

The base includes a flange.

A method of making a protective enclosure for an electrically-conductive element disposed along a component surface includes forming a base, forming a first side with an electrical connector, and forming a second side with an aperture extending therethrough. The method further includes connecting the base, the first side, and the second side such that they at least partially form an internal void.

The method of the preceding paragraph can optionally include, additionally and/or alternatively, any one or more of the following features, configurations and/or additional components:

Forming the base includes contouring the base to the component surface.

The method further includes mounting the base to the component surface.

The method further includes introducing a potting material into the internal void through the aperture.

The method further includes covering at least a portion of the electrically-conductive element with the potting material.

The method further includes optionally removing the enclosure after the potting material has cured.

The base, the first side, and the second side are formed using a 3D printing technique.

The 3D printing technique is a vat photopolymerization technique.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A protective enclosure for an electrically-conductive element disposed along a component surface, the enclosure comprising:
   a base;
   a first side comprising an electrical connector;
   a second side comprising an aperture configured to receive a potting material;
   an internal void at least partially defined by the base, the first side, and the second side, the internal void being in communication with an external environment via the aperture; and
   an anchoring mechanism within the internal void and disposed around the electrically-conductive element;
   wherein the internal void comprises the potting material and a potting-free region adjacent the potting material; and
   wherein the anchoring mechanism is positioned in the potting-free region.

2. The enclosure of claim 1, wherein the base is mountable to the component surface.

3. The enclosure of claim 1, wherein the electrically-conductive element comprises a wire.

4. The enclosure of claim 3, wherein the potting material covers at least a portion of the electrically-conductive element within the internal void.

5. The enclosure of claim 4, wherein the potting material comprises an epoxy material or a polymer material.

6. The enclosure of claim 1, wherein the component is a floor panel or a leading edge.

7. The enclosure of claim 1, wherein the base, the first side, and the second side are formed from a material selected from the group consisting of: nylon, ABS, polyurethane, epoxy, phenolic, and combinations thereof.

8. The enclosure of claim 7, wherein the material is semitransparent.

9. The enclosure of claim 1, wherein the first side is orthogonal to the base.

10. The enclosure of claim 1, wherein the first side is parallel to the base.

11. The enclosure of claim 1, wherein the base is non-planar.

12. The enclosure of claim 1, wherein the base comprises a flange.

13. A method of making a protective enclosure for an electrically-conductive element disposed along a component surface, the method comprising:
    forming a base;
    forming a first side comprising an electrical connector; and
    forming a second side comprising an aperture extending therethrough;
    connecting the base, the first side, and the second side such that they at least partially form an internal void;
    partially filling the internal void with a potting material such that the internal void comprises the potting material and a potting-free region adjacent the potting material; and
    disposing an anchoring mechanism about the electrically-conductive element in the potting-free region.

14. The method of claim 13, wherein forming the base comprises contouring the base to the component surface.

15. The method of claim 13 and further comprising: mounting the base to the component surface.

16. The method of claim 13, wherein partially filling the internal void with the potting material comprises introducing the potting material into the internal void through the aperture.

17. The method of claim 16 and further comprising: covering at least a portion of the electrically-conductive element with the potting material.

18. The method of claim 16 and further comprising: optionally removing the enclosure after the potting material has cured.

19. The method of claim 13, wherein the base, the first side, and the second side are formed using a 3D printing technique.

20. The method of claim 19, wherein the 3D printing technique is a vat photopolymerization technique.

* * * * *